United States Patent
Li et al.

(10) Patent No.: US 12,322,573 B2
(45) Date of Patent: Jun. 3, 2025

(54) PULSING PLASMA TREATMENT FOR FILM DENSIFICATION

(71) Applicant: Applied Materials, Inc., Santa Clara, CA (US)

(72) Inventors: Rui Li, San Jose, CA (US); Xiangjin Xie, Fremont, CA (US); Xianmin Tang, San Jose, CA (US); Anthony Chih-Tung Chan, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 17/733,331

(22) Filed: Apr. 29, 2022

(65) Prior Publication Data

US 2022/0364230 A1    Nov. 17, 2022

Related U.S. Application Data

(60) Provisional application No. 63/187,878, filed on May 12, 2021.

(51) Int. Cl.
| | |
|---|---|
| *C23C 16/34* | (2006.01) |
| *C23C 16/04* | (2006.01) |
| *C23C 16/455* | (2006.01) |
| *C23C 16/52* | (2006.01) |
| *C23C 16/56* | (2006.01) |
| *H01J 37/32* | (2006.01) |
| *H01L 21/02* | (2006.01) |
| *H01L 21/3105* | (2006.01) |
| *H01L 21/768* | (2006.01) |

(52) U.S. Cl.
CPC ...... *H01J 37/32174* (2013.01); *C23C 16/045* (2013.01); *C23C 16/34* (2013.01); *C23C 16/4554* (2013.01); *C23C 16/52* (2013.01); *C23C 16/56* (2013.01); *H01L 21/0234* (2013.01); *H01L 21/3105* (2013.01); *H01L 21/76856* (2013.01); *H01L 21/0228* (2013.01)

(58) Field of Classification Search
None
See application file for complete search history.

(56) References Cited

U.S. PATENT DOCUMENTS

| | | | |
|---|---|---|---|
| 7,514,375 B1 | 4/2009 | Shanker et al. | |
| 7,842,355 B2 * | 11/2010 | Stowell | C23C 16/401 427/470 |

(Continued)

OTHER PUBLICATIONS

PCT International Search Report and Written Opinion for PCT/US2022/028222 dated Aug. 26, 2022.

*Primary Examiner* — Jose I Hernandez-Kenney
(74) *Attorney, Agent, or Firm* — Moser Taboada (57) ABSTRACT

Methods and apparatus for forming a barrier layer are provided herein. In some embodiments, a method of forming a barrier layer on a substrate includes treating an exposed layer deposited on a substrate and within a feature of the substrate by pulsing a bias power applied to a substrate support supporting the substrate while exposing the layer to a plasma. The exposed layer can be deposited by an atomic layer deposition process, and can be, for example, a tantalum nitride layer. The bias power can be up to 500 watts of RF power at a pulse frequency of about 1 Hz to about 10 kHz. The bias power can be pulsed uniformly or at multiple different levels.

13 Claims, 3 Drawing Sheets

(56) References Cited

U.S. PATENT DOCUMENTS

| | | | |
|---|---|---|---|
| 2003/0129827 A1* | 7/2003 | Lee | C23C 16/401 |
| | | | 257/E21.264 |
| 2010/0285237 A1* | 11/2010 | Ditizio | C23C 16/34 |
| | | | 977/891 |
| 2014/0154615 A1 | 6/2014 | Yu et al. | |
| 2016/0118256 A1 | 4/2016 | Rastogi et al. | |
| 2018/0005814 A1* | 1/2018 | Kumar | C23C 16/345 |
| 2018/0005850 A1* | 1/2018 | Citla | H01L 21/31116 |
| 2018/0053661 A1 | 2/2018 | Park et al. | |
| 2018/0294162 A1* | 10/2018 | Xie | C23C 14/024 |
| 2019/0371660 A1* | 12/2019 | Kuo | C23C 16/45529 |
| 2019/0385908 A1 | 12/2019 | Xie et al. | |
| 2020/0090946 A1 | 3/2020 | Citla et al. | |
| 2020/0111659 A1* | 4/2020 | Liu | H01L 21/02164 |
| 2020/0161171 A1* | 5/2020 | Colombeau | H01L 21/76224 |
| 2021/0175107 A1 | 6/2021 | Savandaiah et al. | |

\* cited by examiner

PULSING PLASMA TREATMENT FOR FILM DENSIFICATION

CROSS-REFERENCE TO RELATED APPLICATIONS

This application claims benefit of U.S. provisional patent application Ser. No. 63/187,878, filed May 12, 2021, which is herein incorporated by reference in its entirety.

FIELD

Embodiments of the disclosure generally relate to methods of treating and/or doping barrier layers. More particularly, some embodiments of the disclosure are directed to methods of treating and doping ALD tantalum nitride films with cobalt.

BACKGROUND

A substrate is used to build structures or devices for the semiconductor industry. The devices are constructed using thin film deposition to deposit layers of materials to form conductors, vias, semiconductors, and other structures/devices in the substrate. As the sizes of these devices shrink due to the demand for smaller and faster electronics, greater control over the thin film deposition processes is required to ensure proper device functionality. The smaller size of devices has led to a shift from using physical vapor deposition (PVD) chambers to atomic layer deposition (ALD) chambers. The ALD chambers allow surface control methods to produce highly uniform films over the entire device structure. However, when ALD chambers are used to produce barrier films, the barrier films have a high resistivity and low density, providing a poor quality barrier film. PVD chambers produce films with good barrier properties like higher density and lower resistivity, but the films are non-conformal, often resulting in improperly constructed devices on the substrate.

For the 3 nm node and below, barrier and liner thickness for copper interconnects becomes even more challenging with respect to RC reduction and device reliability. The inventors have observed that the thickness of a barrier film and liner at smaller device nodes, such as at 3 nm or below, can cause fabrication issues. For example, greater thicknesses provide less space for copper gapfill and increase resistivity. However, reducing the overall thickness of barrier and liner layers in a device structure at small node sizes is challenging.

Therefore, the inventors have provided improved methods and apparatus for providing improved barrier films.

SUMMARY

Methods and apparatus for forming a barrier layer are provided herein. In some embodiments, a method of forming a barrier layer on a substrate includes treating an exposed layer deposited on a substrate and within a feature of the substrate by pulsing a bias power applied to a substrate support supporting the substrate while exposing the layer to a plasma. The exposed layer can be deposited by an atomic layer deposition process, and can be, for example, a tantalum nitride layer. The plasma can comprise a source gas including one or more of a noble gas, nitrogen ($N_2$), oxygen gas ($O_2$), or water vapor ($H_2O$). The bias power can be up to 500 watts of RF power at a pulse frequency of about 1 Hz. to about 10 kHz. The bias power can have a frequency of about 0.1 to about 99 MHz. In some embodiments, the bias power can be pulsed at a first level including a first amount of RF power having a pulse frequency of about 1 to about 10 kHz, followed by pulsing at a second level including a second amount of RF power having a pulse frequency of about 1 Hz to about 10 kHz, wherein the second amount is greater than the first amount. In some embodiments, the first amount is about 10 to about 150 watts and the second amount is about 100 to about 500 watts. For example, in some embodiments, pulsing the bias power can include providing about 10 to about 150 watts of RF power at a pulse frequency of about 1 Hz to about 10 kHz for a total duration of up to about 10 seconds, followed by increasing the bias power to about 100 to about 500 watts of RF power at a pulse frequency of about 1 Hz to about 10 kHz for a total duration of up to about 10 seconds.

In some embodiments, a method of forming a barrier layer on a substrate includes depositing a layer on a substrate and within a feature of the substrate; and treating the layer by pulsing a bias power applied to a substrate support supporting the substrate while exposing the layer to a plasma formed from an inert gas to densify the layer. Treating the layer by pulsing the bias power can be performed as described in any of the embodiments disclosed herein.

In some embodiments, an integrated system for forming a barrier layer on a substrate is provided. In some embodiments, an integrated system for forming a barrier layer on a substrate includes a deposition chamber configured for depositing a layer in a feature of a substrate by atomic layer deposition; and a plasma treatment chamber configured to treat the deposited layer with an inert pulsed plasma. The plasma treatment chamber includes a biasable substrate support having am RF bias electrode disposed therein; and a pulse controller configured to pulse an incoming RF signal provided to the RF bias electrode. In some embodiments, the deposition chamber and the plasma treatment chamber are separate chambers coupled to a central vacuum transfer chamber configured to move a substrate from the deposition chamber to the plasma treatment chamber. Alternatively, in some embodiments, the deposition chamber and the plasma treatment chamber are the same chamber. The integrated system can further include an RF power source coupled to the RF bias electrode to provide the incoming RF signal to the RF bias electrode, wherein the RF power source is configured to provide RF power at a frequency of about 0.1 to about 99 MHz. The pulse controller can be configured to pulse the incoming RF signal at a pulse frequency of about 1 Hz to about 10 kHz. The integrated system can further include a gas source coupled to the plasma treatment chamber and configured to provide one or more of a noble gas, nitrogen ($N_2$), oxygen gas ($O_2$), or water vapor ($H_2O$).

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Substrates can include, without limitation, semiconductor wafers. In addition, where a film/layer or partial film/layer has been deposited onto a substrate surface, the exposed surface of the newly deposited film/layer becomes the substrate surface. What a given substrate surface comprises will depend on what films are to be deposited, as well as the particular chemistry used.

As used herein, the terms "reactive gas", "precursor", "reactant", and the like, are used interchangeably to mean a gas that includes a species which is reactive with a substrate surface. For example, a first "reactive gas" may simply adsorb onto the surface of a substrate and be available for further chemical reaction with a second reactive gas.

The term "about" as used herein means approximately or nearly and in the context of a numerical value or range set forth means a variation of +/−15%, or less, of the numerical value. For example, a value differing by +/−14%, +/−10%, +/−5%, +/−2%, or +/−1%, would satisfy the definition of about.

For substrate devices of 3 nm node and smaller, PVD barrier films and copper (Cu) interconnects become more challenging in RC (resistance/capacitance) reduction (interconnect time delay). A thinner barrier layer is required in order to reduce the resistance (R). One also needs to consider improving reflow or electro copper plating (ECP) performance by tuning the barrier process. A continuous barrier is required for an effective Cu barrier. Bevel damage, overhang, via resistance and conformality issues, when combined together, are very challenging to overcome for a PVD process. Using ALD processes typically yields good conformal coverage. However, ALD films may have lower density (due to being metal poor) and higher resistivities. So ALD films (as deposited) are often not effective barriers, and ALD films may also causes higher via resistance (due to the uniform film deposition filling the bottom of the via). Plasma Enhanced ALD (PEALD) processes can improve film density but often damage low k materials (e.g., time dependent dielectric breakdown (TDDB)).

Embodiments of the disclosure provide methods and apparatus for forming barrier layers and/or liners which advantageously have smaller thicknesses to provide more room for gap fill comprising copper, cobalt, or other metals (e.g., Mo, W, Ir, Ru) in features. The increased volume of gap fill lowers resistivity and RC delay. Additionally, embodiments of the disclosure provide methods and apparatus for forming barrier layers and/or liners which advantageously prevent diffusion of copper into the substrate, or promote selective deposition of other metals, or improve adhesion of other metals.

The techniques described herein provide solutions to treat films (e.g., ALD films like TaN) with a PVD approach that improves these films for barrier applications (e.g., Cu barrier applications) for 3 nm and below structures, although the techniques can suitable be used in larger structures as well. The approach can also be used to enhance or treat (e.g., increase density) other films (i.e. ALD or CVD) for other applications. Typical films that can be processed can include tantalum nitride (TaN), amongst other materials. The methods disclosed are applicable to materials and films other than TaN such as other nitrides (e.g., niobium, titanium) as well as films comprising other non-metallic elements (e.g., fluorides, chlorides, carbides). However, for the sake of simplicity, many embodiments described will use TaN as an example.

ALD processes can be combined with PVD processes to produce a high quality barrier film. The initial barrier film is deposited on a substrate using ALD processes and then moved to a PVD chamber to treat the barrier film to increase the barrier film's density and purity, thus decreasing the barrier film's resistivity. The processes can be performed with or without a vacuum break between processes.

In general, a film (e.g., TaN) on a substrate is placed in a PVD chamber having a dual frequency (a first and second frequency) which can be used for selective removal of non-metallic elements (e.g., nitrogen) from the film and densifying the film to achieve a PVD-like film for barrier applications. The PVD chamber has dual material sources (a target and a coil) (first and second sources) that can, in some embodiments, also provide a cobalt source for doping the film and depositing a nucleation layer for later bulk deposition.

In some embodiments, the process includes the deposition of the initial film as well as the treatment thereof. For these embodiments, the process can be carried out in an integrated processing system (e.g., a cluster tool) or using single standalone chambers. When an integrated processing system is used, the film is deposited on the substrate and then the substrate is transferred to the PVD chamber for treatment without having a vacuum break. The absence of a vacuum break reduces the overall processing time.

In some embodiments, the integrated processing system can include a single chamber configured for both the ALD deposition of the initial film layer as well as having a biasable substrate support and RF pulse controller configured to operate as described in more detail below.

However, the process may also be completed using standalone chambers. In these embodiments, the film is deposited on the substrate in one chamber, and later processed in a separate PVD chamber. In some embodiments, the substrate encounters a vacuum break, and is degassed and pre-cleaned before insertion into the PVD chamber for treatment. In other embodiments, the substrate, after the film is deposited, is stored under an inert gas and transferred to the PVD chamber for processing without a vacuum break.

Figure 1:
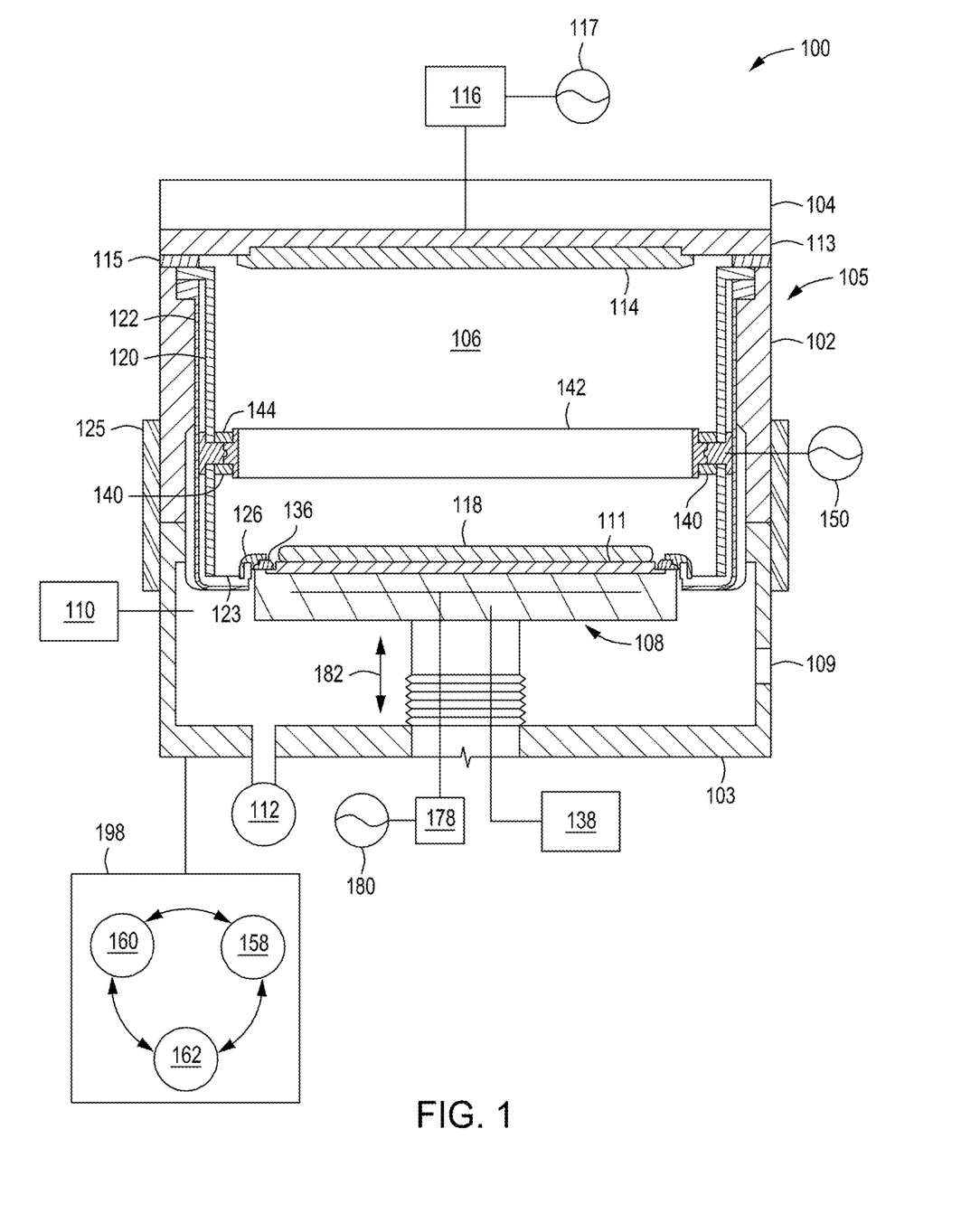
FIG. 1 depicts a cross sectional view of a PVD process chamber in accordance with at least some embodiments of the present disclosure.

FIG. 1 depicts a schematic, cross-sectional view of an illustrative process chamber 100 (e.g., a PVD chamber) in accordance with some embodiments of the present disclosure. Examples of suitable PVD chambers include PVD processing chambers commercially available from Applied Materials, Inc., of Santa Clara, California. However, the methods disclosed may also be used in other processing chambers as described herein or in other process chambers available from other manufacturers. In one embodiment, the process chamber 100 is capable of depositing, for example metals, metal nitrides, metal fluorides, metal carbides, and the like, on a substrate 118.

The process chamber 100 has a chamber body 105 that includes sidewalls 102, a bottom 103, and a lid assembly 104 all of which enclose an interior volume 106. A substrate support 108 is disposed in a lower portion of the interior volume 106 of the process chamber 100 opposite a target 114. A substrate transfer port 109 is formed in the sidewalls 102 for transferring substrates into and out of the interior volume 106.

A gas source 110 is coupled to the process chamber 100 to supply process gases into the interior volume 106. In one embodiment, process gases may include inert gases, non-reactive gases, and reactive gases, etc. Examples of process gases that may be provided by the gas source 110 include, but not limited to, argon gas (Ar), helium (He), krypton (Kr), neon (Ne), nitrogen gas ($N_2$), oxygen gas ($O_2$), hydrogen gas ($H_2$), and water vapor ($H_2O$) among others.

A pump 112 is coupled to the process chamber 100 in communication with the interior volume 106 to control the pressure of the interior volume 106. In one embodiment, the pressure of the process chamber 100 may be maintained at greater than zero pressure to about 10 mTorr or less. In another embodiment, the pressure within the process chamber 100 may be maintained at about 3 mTorr.

A backing plate 113 may support the target 114 in an upper portion of the interior volume 106. The backing plate 113 may be electrically isolated from the sidewalls 102 by an isolator 115. The target 114 generally provides a source of material which will be deposited on the substrate 118. The target 114 may be fabricated from a material containing titanium (Ti) metal, tantalum (Ta) metal, niobium (Nb) metal, tungsten (W) metal, cobalt (Co) metal, nickel (Ni) metal, copper (Cu) metal, aluminum (Al) metal, manganese (Mn) metal, alloys thereof, combinations thereof, or the like. In an exemplary embodiment depicted herein, the target 114 may be fabricated with cobalt (Co) metal.

The target 114 may be coupled to a source assembly 116 comprising a power supply 117 for the target 114. In some embodiments, the power supply 117 may be an RF generator. In some embodiments, the power supply 117 may alternatively be a DC source power supply. In some embodiments, the power supply 117 may include both DC and RF power sources.

An additional RF power source 180 may also be coupled to the process chamber 100 through the substrate support 108 to provide a bias power between the target 114 and the substrate support 108. In some embodiments, the RF power source 180 may provide up to about 500 watts, such as about 10 to about 500 watts, of RF energy at a frequency between about 1 MHz and about 100 MHz, such as about 13.56 MHz, to the substrate support 108 to bias the substrate 118. In some embodiments, the RF power source 180 operates at an RF power frequency greater than the operating RF power frequency of the power source 150 to bias the substrate 218.

The RF power source 180 includes or is coupled to a pulse controller (shown schematically as pulse controller 178) configured to pulse the RF energy provided by the RF power source 180 at a pulse frequency of about 1 Hz to about 10 kHz. The pulse controller 178 can be part of the RF power source 180, part of the controller 198 (described below), or a separate component. The pulse controller 178 is operatively coupled to and controlled by the controller 198. The pulse controller 178 can pulse the RF energy provided by the RF power source 180 at duty cycles of greater than zero and less than 100.

The substrate support 108 may be moveable between a raised position and a lowered position, as shown by arrow 182. In the lowered position, a support surface 111 of the substrate support 108 may be aligned with or just below the substrate transfer port 109 to facilitate entry and removal of the substrate 118 to and from the process chamber 100. The support surface 111 may have an edge deposition ring 136 sized to receive the substrate 118 thereon while protecting the substrate support 108 from plasma and deposited material. The substrate support 108 may be moved to the raised position closer to the target 114 for processing the substrate 118 in the process chamber 100. A cover ring 126 may engage the edge deposition ring 136 when the substrate support 108 is in the raised position. The cover ring 126 may prevent deposition material from bridging between the substrate 118 and the substrate support 108. When the substrate support 108 is in the lowered position, the cover ring 126 is suspended above the substrate support 108 and substrate 118 positioned thereon to allow for substrate transfer.

During substrate transfer to/from the process chamber 100, a robot blade (not shown) having the substrate 118 thereon is extended through the substrate transfer port 109. Lift pins (not shown) extend through the support surface 111 of the substrate support 108 to lift the substrate 118 from the support surface 111 of the substrate support 108, thus allowing space for the robot blade to pass between the substrate 118 and substrate support 108. The robot may then carry the substrate 118 into or out of the process chamber 100 through the substrate transfer port 109. Raising and lowering of the substrate support 108 and/or the lift pins may be controlled by controller 198 (described below).

During sputter deposition, the temperature of the substrate 118 may be controlled by utilizing a thermal controller 138 disposed in the substrate support 108. The substrate 118 may be optionally heated to a desired temperature for processing. In some embodiments, the optional heating can be used to bring the substrate and/or film temperature to a temperature of about 200 to about 400 degrees Celsius. In other embodiments, the substrate may be processed at room temperature (about 15 degrees Celsius to about 30 degrees Celsius). In other embodiments the temperature is in a range of about 15 degrees to about 400 degrees Celsius. After processing, the substrate 118 may be rapidly cooled utilizing the thermal controller 138 disposed in the substrate support 108. The thermal controller 138 controls the temperature of the substrate 118 and may be utilized to change the temperature of the substrate 118 from a first temperature to a second temperature in a matter of seconds to about a minute.

An inner shield 120 may be positioned in the interior volume 106 between the target 114 and the substrate support 108. The inner shield 120 may be formed of aluminum or stainless steel among other materials. In one embodiment, the inner shield 120 is formed from stainless steel. An outer shield 122 may be formed between the inner shield 120 and the sidewall 102. The outer shield 122 may be formed from aluminum or stainless steel among other materials. The outer shield 122 may extend past the inner shield 120 and is configured to support the cover ring 126 when the substrate support 108 is in the lowered position.

In one embodiment, the inner shield 120 includes a radial flange 123 that includes an inner diameter that is greater than an outer diameter of the inner shield 120. The radial flange 123 extends from the inner shield 120 at an angle greater than about ninety degrees relative to the inside diameter surface of the inner shield 120. The radial flange 123 may be a circular ridge extending from the surface of the inner shield 120 and is generally adapted to mate with a recess formed in the cover ring 126 disposed on the substrate support 108. The recessed may be a circular groove formed in the cover ring 126 which centers the cover ring 126 with respect to the longitudinal axis of the substrate support 108.

In some embodiments, the process chamber 100 may include an inductive coil 142. The inductive coil 142 of the process chamber 100 may having one turn or more than one turn. The inductive coil 142 may be just inside the inner shield 120 and positioned above the substrate support 108. The inductive coil 142 may be positioned nearer to the substrate support 108 than the target 114. The inductive coil 142 may be formed from a material similar or equal in composition to the target 114, such as, for example, cobalt, to act as a secondary sputtering target. The inductive coil 142 is supported from the inner shield 120 by a plurality of coil spacers 140. The coil spacers 140 may electrically isolated the inductive coil 142 from the inner shield 120 and other chamber components and to protect from being sputtered on to avoid shorting or creating an unwanted plasma excitation source. The dual sources aid in providing a stable plasma and enough energy to selectively etch non-metallic elements (e.g., nitrogen from a nitride film) while keeping a metal film intact or at least minimally etched.

The inductive coil 142 may be coupled to a power source 150. The power source 150 may have electrical leads which penetrate the sidewall 102 of the process chamber 100, the outer shield 122, the inner shield 120 and the coil spacers 140. The electrical leads connect to an electrical hub 144 on the inductive coil 142 for providing power to the inductive coil 142. The electrical hub 144 may have a plurality of insulated electrical connections for providing power to the inductive coil 142. Additionally, the electrical hubs 144 may be configured to interface with the coil spacers 140 and support the inductive coil 142. The power source 150, in some embodiments, applies current to the inductive coil 142 to induce an RF field within the process chamber 100 and couple power to the plasma for increasing the plasma density, i.e., concentration of reactive ions. In some embodiments, the inductive coil 142 is operated at an RF power frequency less than the RF power frequency of the RF power source 180. In some embodiments, the RF power frequency supplied to the inductive coil 142 is about 2 MHz. In some embodiments the RF power frequency may operate in a range of about 1.8 MHz to about 2.2 MHz. In some embodiments, the RF power frequency may range from about 0.1 MHz to 99 MHz. In some embodiments, the inductive coil 142 is made of a material, such as a metal material, that can be sputtered onto a substrate. The power source 150 may then also apply DC power to the inductive coil 142 to enable sputtering of the inductive coil 142 while coupling RF power to the plasma.

A controller 198 is coupled to the process chamber 100. The controller 198 includes a central processing unit (CPU) 160, a memory 158, and support circuits 162. The controller 198 is utilized to control the process sequence, regulating the gas flows from the gas source 110 into the process chamber 100, controlling ion bombardment of the target 114 and the inductive coil 142, controlling bias power applied to the substrate support 108, and the like. More generally, the controller 198 is used to perform the methods disclosed herein.

The CPU 160 may be of any form of a general-purpose computer processor that can be used in an industrial setting. The software routines can be stored in the memory 158, such as random access memory, read only memory, floppy or hard disk drive, or other form of digital storage. The support circuits 162 are conventionally coupled to the CPU 160 and may comprise cache, clock circuits, input/output subsystems, power supplies, and the like. The software routines, when executed by the CPU 160, transform the CPU 160 into a specific purpose computer (controller) 198 that controls the process chamber 100 such that processes are performed in accordance with the present disclosure. The software routines may also be stored and/or executed by a second controller (not shown) that is located remotely from the process chamber 100.

In some applications, for example when depositing a barrier layer in a feature on a substrate, the inventors have observed that although PVD chambers produce films with good barrier properties like high density and low resistivity, the films are typically non-conformal, often resulting in improperly constructed devices on the substrate. Moreover, while ALD chambers produce highly uniform films over the entire device structure, ALD barrier films tend to have a high resistivity and low density, providing a poor quality barrier film. For example, the inventors have observed that ALD TaN density is low and plasma treatment (such as an Ar plasma treatment) to densify the film risks damage to the underlying low-k material layer.

However, treatment of such films in accordance with the present disclosure advantageously increases the film density, with reduced or no damage to the film and/or to the underlying dielectric layer. For example, in some embodiments, methods in accordance with the present disclosure can be used to treat films to increase the density of the film, for example films being used as a barrier layer (for example a barrier layer for an interconnect, such as a copper interconnect), for example a tantalum nitride film, for example films deposited by an ALD process, for example a tantalum nitride films deposited via ALD. Treatment with the pulsed plasma advantageously maintains the same ion energy as continuous wave mode, but reduces the total treatment dose (ion energy×time), thus reducing damage level to low-k and maintaining the same treatment efficiency. Pulsed RF plasma treatment also provides a control knob of power level to further tune the process. For example, a continuous wave mode (continuous RF bias application during the plasma treatment) can typically last only 1-2 seconds due to machine and materials limitations. However, pulsed bias can allow lengthened process time to enable better control of the process. Moreover, the pulsed bias mode enables a multi-level processing, such as for example, a low to high power mode where low power is initially provided to initially soft treat the surface and prepare the surface to receive a high power mode to bring more ions into the structure (e.g., the opening of the feature) to assist with sidewall treatment of the barrier layer material deposited on the sidewall of the feature. Hence, treatment of films in accordance with the present disclosure can advantageously provide one or more of improved nonuniformity (e.g., more uniform process results) using high instantaneous RF bias, extending the process window to reduce damage to materials layers and/or underlying material layers, and reducing amount of material etched during the treatment process to enable finer control of the process.

Figure 2:
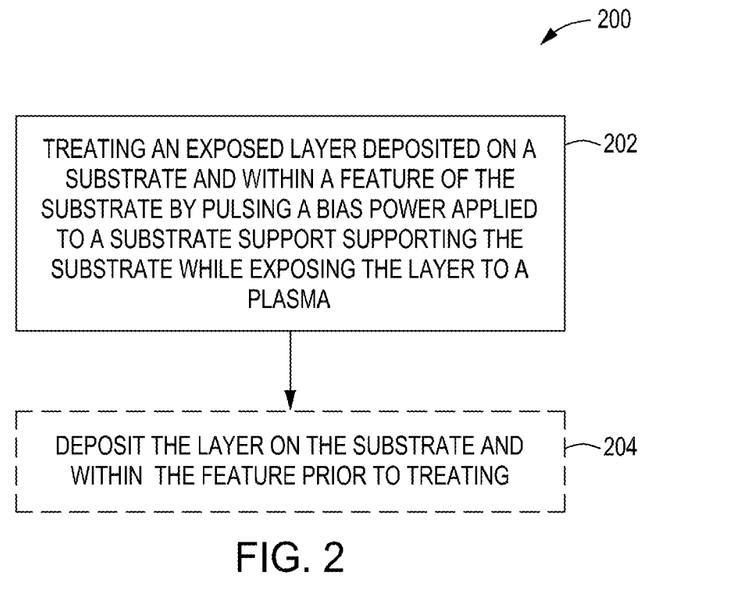
FIG. 2 depicts a flow diagram of a method of processing a substrate in accordance with at least some embodiments of the present disclosure.

For example, FIG. 2 depicts a flow diagram of a method 200 of processing a substrate in accordance with at least some embodiments of the present disclosure. The method 200 generally begins at block 202, where an exposed layer deposited on a substrate and within a feature of the substrate is treated by pulsing a bias power applied to a substrate support supporting the substrate while exposing the layer to a plasma.

The inventors have discovered that treating the exposed layer using pulsed RF power reduces ion density/population while maintaining the same ion energy as compared to continuous application of RF substrate bias. Thus, the pulsed treatment process advantageously provides an extended process time window while avoiding over treatment of the exposed layer and reduce damage to the layer or to other material layers on the substrate, such as an underlying dielectric layer.

The bias power can have a frequency of about 0.1 to about 99 MHz. The bias power can have a magnitude of up to about 500 watts. The bias power can be pulsed at a pulse frequency of about 1 Hz to about 10 kHz. The bias power can be pulsed with a duty cycle of greater than zero and less than 100.

Figure 3:
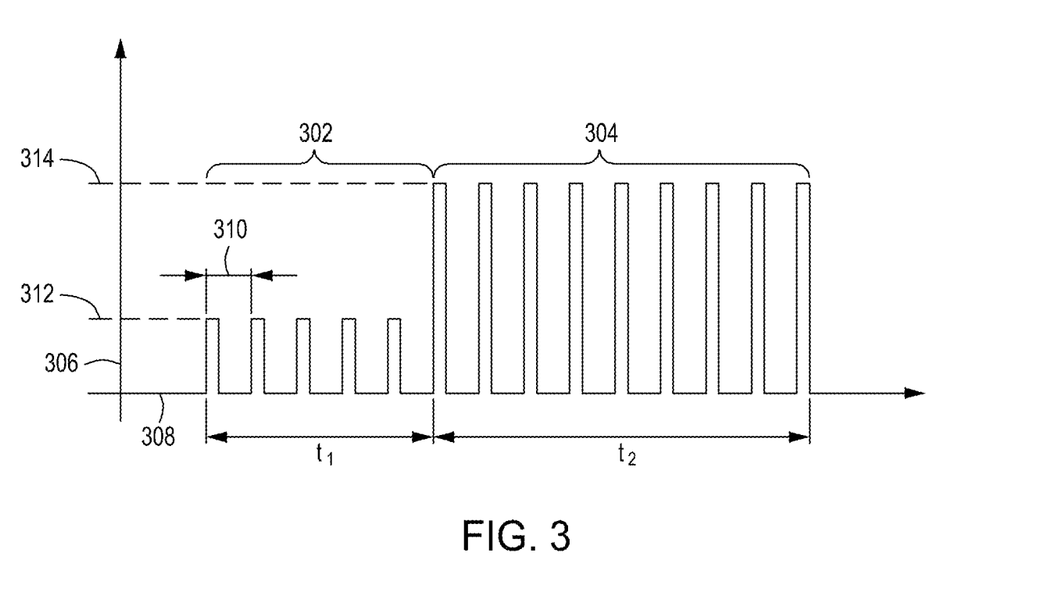
FIG. 3 depicts a schematic diagram of pulsing parameters used in methods of processing a substrate in accordance with at least some embodiments of the present disclosure.

For example, FIG. 3 depicts a schematic diagram of pulsing parameters used in methods of processing a substrate in accordance with at least some embodiments of the present disclosure. As depicted in FIG. 3, a pulse waveform is shown graphed over an axis 306 corresponding to the magnitude of the RF power applied and an axis 308 corresponding to time. The graph in FIG. 3 depicts a first pulsing waveform 302, having a duration $t_1$ and a first magnitude 312. The first pulsing waveform 302 comprises a plurality of individual pulses repeated over time. Each pulse is defined by an initial low magnitude, rapid increase to a high magnitude, and return to the initial low magnitude. The initial low magnitude can be zero or some other magnitude lower than the high magnitude. The total time between pulses is indicated at 310. The percentage of 310 during which the RF power is at the first magnitude 312 is the duty cycle. A duty cycle of 100 means that the RF power is maintained at the magnitude (e.g., continuous wave mode) and a duty cycle of zero corresponds to no RF power applied. In some embodiments, the treatment process can include pulsing at a single level, for example corresponding to the first pulsing waveform 302. In some embodiments, first pulsing waveform 302 can be followed by pulsing at a second level, such as indicated in FIG. 3 by a second pulsing waveform 304, having a duration $t_2$ and a second magnitude 314. The second magnitude is greater than the first magnitude.

In some embodiments, the treatment process has a single level—meaning the RF power is pulsed between a substantially uniform power magnitude and a lower magnitude, such as zero or an off state. In some embodiments, the treatment process has a plurality of levels, such as two or more levels. For example, the RF power can be pulsed between a substantially uniform first power level (e.g., magnitude) and a lower magnitude, such as zero or an off state for a first duration, then the RF power can be pulsed between a substantially uniform second power level (e.g., magnitude) greater than the first power level and a lower magnitude, such as zero or an off state for a second duration, optionally continued by pulsing the RF power at different power levels which may be greater than or less then the preceding power level. In some embodiments, the treatment process comprises only two levels, a first low level treatment and a subsequent second high level (relative to the low level) treatment.

In some embodiments, pulsing the bias power comprises providing up to 500 watts of RF power at a pulse frequency of about 1 Hz to about 10 kHz. In some embodiments, pulsing the bias power comprises providing up to 500 watts of RF power at a pulse frequency of about 1 Hz to about 10 kHz for a total duration of up to about 10 seconds.

In some embodiments, pulsing the bias power comprises providing a first amount of RF power at a pulse frequency of about 1 Hz to about 10 kHz, followed by providing a second amount of RF power at a pulse frequency of about 1 Hz to about 10 kHz, wherein the second amount is greater than the first amount. In some embodiments, the first amount is about 10 to about 150 watts and the second amount is about 100 to about 500 watts. In some embodiments, pulsing the bias power comprises providing about 10 to about 150 watts of RF power at a pulse frequency of about 1 Hz to about 10 kHz for a total duration of up to about 10 seconds, followed by increasing the bias power to about 100 to about 500 watts of RF power at a pulse frequency of about 1 Hz to about 10 kHz for a total duration of up to about 10 seconds.

In some embodiments, the plasma comprises a source gas including one or more of a noble gas, nitrogen ($N_2$), oxygen gas ($O_2$), or water vapor ($H_2O$). For example, in some embodiments, the gas source 110 supplies a gas into the interior volume 106. In some embodiments, the gas 208 comprises a noble gas such as, for example, argon (Ar), helium (He), xenon (Xe), neon (Ne), or krypton (Kr), or a reactive gas, such as, for example, a nitrogen-based gas ($N_2$), oxygen gas ($O_2$), or water vapor ($H_2O$). In some embodiments, the gas can also be a combination of a one or more noble gases and one or more reactive gases. The gas is introduced into plasma formed above the substrate 118. The plasma can be formed by applying RF power from one or both of the power supply 117 or power source 150 while providing the source gas to the interior volume 106.

In some embodiments, for example, the pump 112 can keep the interior volume 106 at a pressure of less than or equal to about 10 mTorr. In some embodiments, for example, the thermal controller 138 can keep the substrate 118 at about 200 to about 400 degrees Celsius or at room temperature (about 15 degrees Celsius to about 30 degrees Celsius), or any temperature there between (e.g., about 15 degrees C. to about 400 degrees C.). In some embodiments, a magnetic field is used to control ion distribution. The magnetic field, in some embodiments, can be dynamically controlled by an electromagnet 125 to affect where the ions are distributed on the substrate 118.

In some embodiments, the exposed layer is deposited by an atomic layer deposition process. The exposed layer can be deposited using conventional ALD deposition processes and is generally a conformal layer deposited atop the substrate and within features of the substrate, such as trenches, vias, dual damascene structures, or the like. In some embodiments, the exposed layer is a tantalum nitride layer, although other materials layers can also be used. For example, in some embodiments, the material layers deposited and treated as described herein can be any material layer used as a barrier and/or liner layer for features formed in dielectric layers prior to providing a conductive fill. In some embodiments, such features have dimensions corresponding to a 3 nm node or smaller. In some embodiments, the exposed layer is deposited prior to commencing the method 200. Alternatively, and optionally, in some embodiments, the exposed layer is deposited as part of the method 200, as indicated at block 204 in FIG. 2.

The exposed layer may be any suitable thickness. In some embodiments, the thickness of each layer or film is minimized. Without being bound by theory, the inventors believe that smaller barrier and liner layers provide lower resistivity and reduce RC delays. In some embodiments, the layer has a thickness of less than or equal to about 20 angstroms, less than or equal to about 18 angstroms, less than or equal to about 15 angstroms, less than or equal to about 14 angstroms, less than or equal to about 13 angstroms, less than or equal to about 12 angstroms, less than or equal to about 11 angstroms, or less than or equal to about 10 angstroms.

In some embodiments, the ALD process comprises sequentially exposing the substrate to a metal precursor and a reactant. Those skilled in the art will recognize the metal precursors and reactants suitable for producing a film with a predetermined composition. In some embodiments, a TaN film is deposited by exposing a substrate to a tantalum precursor and a nitrogen reactant. In some embodiments, the tantalum precursor comprises pentakis(dimethylamino)tantalum. In some embodiments, the nitrogen reactant comprises one or more of nitrogen gas ($N_2$), ammonia, nitrous oxide or nitrogen dioxide.

In some embodiments, the film comprises tantalum carbide, tantalum nitride, tantalum fluoride, niobium carbide, niobium nitride, niobium fluoride, titanium carbide, titanium nitride, titanium fluoride, or combinations thereof. In some embodiments, the film comprises more than one metal species (e.g., TiTaN). In some embodiments, the film comprises more than one non-metallic element (e.g., TaCN).

In some embodiments, the film/substrate temperature may be at room temperature during processing. In some embodiments, the film/substrate may be optionally heated to about 200 degrees to about 400 degrees Celsius as indicated at 304. In other embodiments, the film/substrate may be optionally heated from about 15 degrees Celsius to about 400 degrees Celsius. The PVD chamber environment may be maintained at a room temperature or at a medium (e.g., 200 degrees C.) to high (e.g., 400 degrees C.) temperature and very low (e.g., <10 mTorr) pressure environment during the film treatment. In some embodiments, the temperature of the substrate and/or film is maintained at about 325 degrees Celsius. The film on the substrate can be composed of any type of material or combinations of material. For the sake of brevity, the examples of the embodiments use TaN as the film to be treated. In some embodiments, the film is deposited by ALD and before being treated in the PVD chamber has the typical properties associated with ALD, namely that if used as a barrier film, the film is conformal but has low density and high resistivity, making the ALD film a poor barrier film.

The layer is etched to increase density and remove non-metallic elements from the film as discussed above. For example, the PVD chamber environment, such as the interior volume 106, can be filled with at least one gas, such as, for example, the gases discussed above, and at a pressure greater than zero pressure and less than or equal to about 10 mTorr. The gas is used to provide an etch of the substrate, such as substrate 118, to release non-metallic elements from the film (e.g., nitrogen from a nitride film). Without being bound by theory, the inventors believe that if the pressure is not kept very low, some materials, such as tantalum, have a high affinity for oxygen and higher pressures may produce nitrogen oxide, making the nitrogen removal inefficient.

The film, after being treated in the PVD chamber, has the typical properties associated with PVD processes but with the conformal properties of an ALD film. The dynamic treatment process creates a long lasting, high quality barrier film with high density and low resistivity.

In some embodiments, the method continues by optionally depositing a copper film on the layer. Those skilled in the art will recognize suitable processes for depositing a copper film, including but not limited to CVD, ALD and PVD processes. In some embodiments, the treated layer is effective to prevent diffusion of copper from the copper film into the substrate. In some embodiments, the treated layer promotes adhesion for other metal deposition or facilitates selective metal deposition.

The methods described herein may be performed in individual process chambers that may be provided in a standalone configuration or as part of a cluster tool. For example, in some embodiments, an integrated system for forming a barrier layer on a substrate comprises: a deposition chamber configured for depositing a layer in a feature of a substrate by atomic layer deposition; and a plasma treatment chamber configured to treat the deposited layer with an inert pulsed plasma, the plasma treatment chamber comprising: a biasable substrate support having am RF bias electrode disposed therein; and a pulse controller configured to pulse an incoming RF signal provided to the RF bias electrode.

In some embodiments, the integrated system is configured such that either the deposition chamber and the plasma treatment chamber are separate chambers coupled to a central vacuum transfer chamber configured to move a substrate from the deposition chamber to the plasma treatment chamber, or such that the deposition chamber and the plasma treatment chamber are the same chamber.

In some embodiments, the integrated system further includes an RF power source coupled to the RF bias electrode to provide the incoming RF signal to the RF bias electrode, wherein the RF power source is configured to provide RF power at a frequency of about 0.1 to about 99 MHz, and wherein the pulse controller is configured to pulse the incoming RF signal at a pulse frequency of about 1 Hz to about 10 kHz.

In some embodiments, the integrated system further comprises a gas source coupled to the plasma treatment chamber and configured to provide one or more of a noble gas, nitrogen ($N_2$), oxygen gas ($O_2$), or water vapor ($H_2O$).

Figure 4:
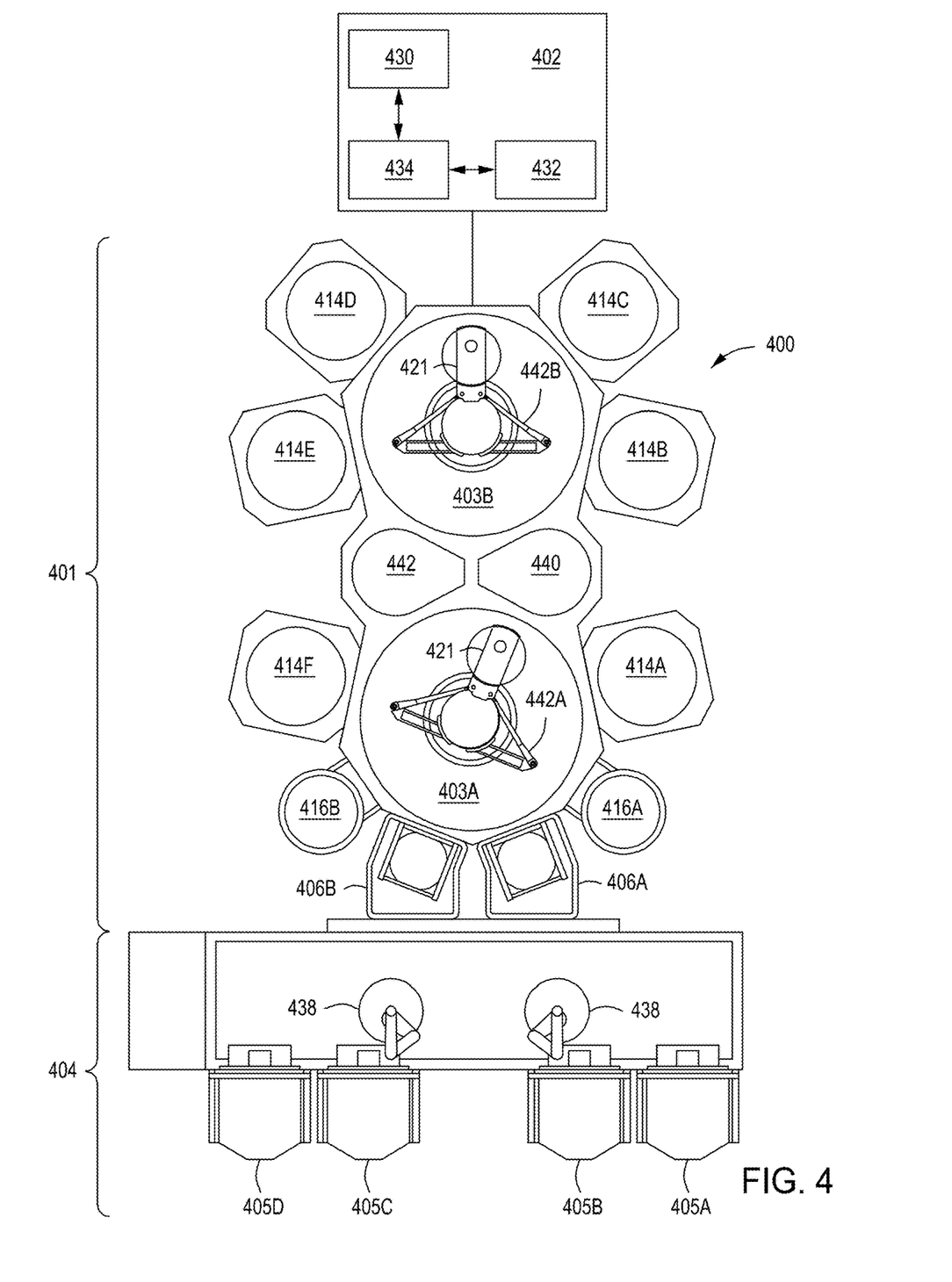
FIG. 4 depicts a cluster tool suitable to perform methods for processing a substrate in accordance with at least some embodiments of the present disclosure.

For example, an integrated tool 400 (i.e., cluster tool) is described below with respect to FIG. 4. The advantage of using an integrated tool 400 is that there is no vacuum break and no requirement to degas and pre-clean a substrate before treatment in a PVD chamber. Examples of the integrated tool 400 include the CENTURA® and ENDURA® line of integrated tools, available from Applied Materials, Inc., of Santa Clara, California. However, the methods described herein may be practiced using other cluster tools having suitable process chambers, or in other suitable process chambers. For example, in some embodiments the inventive methods discussed above may advantageously be performed in an integrated tool such that there are limited or no vacuum breaks between processes. For example, reduced vacuum breaks may limit or prevent contamination of the substrate.

The integrated tool 400 includes a vacuum-tight processing platform 401, a factory interface 404, and a system controller 402. The processing platform 401 comprises multiple processing chambers, such as 414A, 414B, 414C, 414D, 414E, and 414F operatively coupled to a vacuum substrate transfer chamber (transfer chambers 403A, 403B). The factory interface 404 is operatively coupled to the transfer chamber 403A by one or more load lock chambers (two load lock chambers, such as 406A and 406B shown in FIG. 4).

In some embodiments, the factory interface 404 comprises at least one docking station 407, at least one factory interface robot 438 to facilitate the transfer of the semiconductor substrates. The docking station 407 is configured to accept one or more front opening unified pod (FOUP). Four FOUPS, such as 405A, 405B, 405C, and 405D are shown in the embodiment of FIG. 4. The factory interface robot 438 is configured to transfer the substrates from the factory interface 404 to the processing platform 401 through the load lock chambers, such as 406A and 406B. Each of the load lock chambers 406A and 406B have a first port coupled to the factory interface 404 and a second port coupled to the transfer chamber 403A. The load lock chamber 406A and 406B are coupled to a pressure control system (not shown) which pumps down and vents the load lock chambers 406A and 406B to facilitate passing the substrates between the vacuum environment of the transfer chamber 403A and the substantially ambient (e.g., atmospheric) environment of the factory interface 404. The transfer chambers 403A, 403B have vacuum robots 442A, 442B disposed in the respective transfer chambers 403A, 403B. The vacuum robot 442A is capable of transferring substrates 421 between the load lock chamber 406A, 406B, the processing chambers 414A and 414F and a cooldown station 440 or a pre-clean station 442. The vacuum robot 442B is capable of transferring substrates 421 between the cooldown station 440 or pre-clean station 442 and the processing chambers 414B, 414C, 414D, and 414E.

In some embodiments, the processing chambers 414A, 414B, 414C, 414D, 414E, and 414F are coupled to the transfer chambers 403A, 403B. The processing chambers 414A, 414B, 414C, 414D, 414E, and 414F comprise at least an atomic layer deposition (ALD) process chamber and a physical vapor deposition (PVD) process chamber. Additional chambers may also be provided such as CVD chambers, annealing chambers, additional ALD chambers, additional PVD chambers, or the like. ALD and PVD chambers may include any chambers suitable to perform all or portions of the methods described herein, as discussed above.

In some embodiments, one or more optional service chambers (shown as 416A and 416B) may be coupled to the transfer chamber 403A. The service chambers 416A and 416B may be configured to perform other substrate processes, such as degassing, orientation, substrate metrology, cool down and the like.

The system controller 402 controls the operation of the tool 400 using a direct control of the process chambers 414A, 414B, 414C, 414D, 414E, and 414F or alternatively, by controlling the computers (or controllers) associated with the process chambers 414A, 414B, 414C, 414D, 414E, and 414F and the tool 400. In operation, the system controller 402 enables data collection and feedback from the respective chambers and systems to optimize performance of the tool 400. The system controller 402 generally includes a Central Processing Unit (CPU) 430, a memory 434, and a support circuit 432. The CPU 430 may be any form of a general purpose computer processor that can be used in an industrial setting. The support circuit 432 is conventionally coupled to the CPU 430 and may comprise a cache, clock circuits, input/output subsystems, power supplies, and the like. Software routines, such as a method as described above may be stored in the memory 434 and, when executed by the CPU 430, transform the CPU 430 into a specific purpose computer (system controller 402). The software routines may also be stored and/or executed by a second controller (not shown) that is located remotely from the tool 400.

Although the disclosure herein has been described with reference to particular embodiments, these embodiments are merely illustrative of the principles and applications of the present disclosure. Thus, those skilled in the art appreciate that various modifications and variations can be made to the method and apparatus of the present disclosure without departing from the spirit and scope thereof. Thus, the present disclosure includes modifications and variations that are within the scope of the appended claims and their equivalents.

The invention claimed is:

1. A method of forming a barrier layer on a substrate, comprising:
treating an exposed barrier layer deposited over a dielectric layer on a substrate and within a feature of the substrate by pulsing a bias power applied to a substrate support supporting the substrate while exposing the barrier layer to a plasma to form a treated exposed barrier layer;
wherein the pulsing the bias power comprises a first pulsing waveform from an initial low magnitude to a higher first magnitude providing a first amount of RF power up to about 500 watts at a pulse frequency of about 1 Hz to about 10 kHz, followed by a second pulsing waveform different than the first pulsing waveform from the initial low magnitude to a higher second magnitude providing a second amount of RF power up to about 500 watts at a pulse frequency of about 1 Hz to about 10 KHz, wherein the second amount of RF power is greater than the first amount of RF power, wherein the barrier layer comprises a metal nitride, and wherein the treated exposed barrier layer has a higher density and lower resistivity relative to the exposed barrier layer prior to the treating.

2. The method of claim 1, wherein the exposed barrier layer is deposited by an atomic layer deposition process.

3. The method of claim 2, wherein the exposed barrier layer is a tantalum nitride layer.

4. The method of claim 1, further comprising:
depositing the exposed barrier layer on the substrate and within the feature using an atomic layer deposition process.

5. The method of claim 4, wherein the exposed barrier layer is a tantalum nitride layer.

6. The method of claim 1, wherein the first amount of RF power is about 10 to about 150 watts and the second amount of RF power is about 100 to about 500 watts.

7. The method of claim 1, wherein the providing of the first amount of RF power is for a total duration of up to about 10 seconds, and the providing of the second amount of RF power is for a total duration of up to about 10 seconds.

8. The method of claim 1, wherein pulsing the bias power comprises providing about 10 to about 150 watts of RF power at a pulse frequency of about 1 Hz to about 10 KHz for a total duration of up to about 10 seconds, followed by increasing the bias power to about 100 to about 500 watts of RF power at a pulse frequency of about 1 Hz to about 10 KHz for a total duration of up to about 10 seconds.

9. The method of claim 1, wherein the plasma comprises a source gas including one or more of a noble gas, nitrogen ($N_2$), oxygen gas ($O_2$), or water vapor ($H_2O$).

10. The method of claim 1, wherein the bias power has a frequency of about 0.1 to about 99 MHz.

11. A method of forming a barrier layer on a substrate, comprising:

depositing a barrier layer over a dielectric layer on a substrate and within a feature of the substrate using an atomic layer deposition process; and treating the barrier layer by pulsing a bias power applied to a substrate support supporting the substrate while exposing the barrier layer to a plasma formed from an inert gas to densify the barrier layer treating an exposed barrier layer deposited over the dielectric layer on the substrate and within the feature of the substrate by pulsing a bias power applied to a substrate support supporting the substrate while exposing the barrier layer to a plasma to form a treated exposed barrier layer;

wherein the pulsing the bias power comprises a first pulsing waveform from an initial low magnitude to a higher first magnitude providing a first amount of RF power up to about 500 watts at a pulse frequency of about 1 Hz to about 10 kHz, followed by a second pulsing waveform different than the first pulsing waveform from the initial low magnitude to a higher second magnitude providing a second amount of RF power up to about 500 watts at a pulse frequency of about 1 Hz to about 10 KHz, wherein the second amount of RF power is greater than the first amount of RF power.

12. The method of claim 11, wherein the barrier layer is a tantalum nitride layer.

13. The method of claim 11, wherein the first amount of RF power is about 10 to about 150 watts and the second amount of RF power is about 100 to about 500 watts.

\* \* \* \* \*